United States Patent
Krueger et al.

(10) Patent No.: US 6,358,823 B1
(45) Date of Patent: Mar. 19, 2002

(54) METHOD OF FABRICATING ION IMPLANTED DOPING LAYERS IN SEMICONDUCTOR MATERIALS AND INTEGRATED CIRCUITS MADE THEREFROM

(75) Inventors: Dietmar Krueger; Rainer Kurps, both of Frankfurt an der Oder (DE); Boris Romanjuk, Kiev (UA); Viktor Melnik, Kiev (UA); Jaroslav Olich, Kiev (UA)

(73) Assignee: Institut fuer Halbleiterphysik Frankfurt (Oder) GmbH., Frankfurt an der Oder (DE)

( * ) Notice: Subject to any disclaimer, the term of this patent is extended or adjusted under 35 U.S.C. 154(b) by 0 days.

(21) Appl. No.: 09/549,103

(22) Filed: Apr. 12, 2000

(51) Int. Cl.[7] .............................................. H01L 21/266
(52) U.S. Cl. ....................................... 438/515; 438/517
(58) Field of Search ................................. 438/515, 517, 438/510, FOR 152, FOR 155

(56) References Cited

U.S. PATENT DOCUMENTS

| 3,926,682 | A | * | 12/1975 | Shimada et al. |
|---|---|---|---|---|
| 4,904,611 | A | * | 2/1990 | Chiang et al. |
| 5,196,366 | A | * | 3/1993 | Yamazaki et al. |
| 5,837,597 | A | * | 11/1998 | Saito |
| 6,033,974 | A | * | 3/2000 | Henley et al. |
| 6,043,139 | A | * | 3/2000 | Eaglesham et al. |
| 6,087,247 | A | * | 7/2000 | Downey |
| 6,177,343 | B1 | * | 1/2001 | Watanabe et al. |
| 6,214,749 | B1 | * | 4/2001 | Watanabe et al. |

FOREIGN PATENT DOCUMENTS

| DD | 242507 | * | 1/1987 |
|---|---|---|---|
| JP | 60089939 | * | 5/1985 |
| JP | 62089361 | * | 4/1987 |
| JP | 02056928 | * | 2/1990 |
| JP | 04015916 | * | 1/1992 |
| JP | 04249315 | * | 9/1992 |

* cited by examiner

*Primary Examiner*—George Fourson
*Assistant Examiner*—Joannie Adelle Garcia
(74) *Attorney, Agent, or Firm*—Karl Hormann

(57) ABSTRACT

A method of fabricating ion implanted doping layers in semiconductor materials by subjecting the material to an ultrasonic treatment during the implantation of predetermined impurities. In an alternate embodiment ultrasonic vibrations are generated by primary ion currents of sufficient density reflected by a piezo-electric element applied to the semiconductor material.

8 Claims, 2 Drawing Sheets

METHOD OF FABRICATING ION IMPLANTED DOPING LAYERS IN SEMICONDUCTOR MATERIALS AND INTEGRATED CIRCUITS MADE THEREFROM

BACKGROUND OF THE INVENTION

1. Field of the Invention

The invention, in general, relates to a novel method of fabricating ion implanted doping layers in semiconductor layers and, more particularly, to a method of the kind referred to utilizing ultrasonic techniques to produce implantation layers of an extremely shallow depth of penetration.

2. The Prior Art.

Semiconductor materials such as silicon, gallium arsenide and gallium phosphide are used on a large scale for the fabrication of semiconductor devices. In a manner typical of modern semiconductor technologies, electrically active areas are fabricated in a substrate material during the course of their fabrication process, by imbedding p- and n-dopants by ion implantation.

Even today, the advance of modern semiconductor technology for the production of highly integrated switching circuits is to a substantial measure dependent upon the fabrication of extremely small electrically active areas and extremely flat or shallow junctions. The furthest developed demands are those in the field of silicon-based microelectronics. While the emphasis will hereafter be placed upon this field, it will nevertheless be understood by those skilled in the art that the discussion and its conclusions may, with certain modifications, be broadened to other semiconductor materials. The relevant demands on the silicon-based technology have heretofore been well described by the "SIA Roadmap" (National Technology Roadmap for Semiconductors; Semiconductor Industry Association (SIA) (1997)) of silicon microelectronics. In accordance therewith, depths of pn-junctions between 50 nm and 120 nm have been demanded in the year 1998 for advanced highly integrated switching circuits; by 2010 they are to be reduced to 10 nm to 30 nm in order to keep pace with the predictable lateral scaling.

Such a reduction does not only require a lowering of the implantation energies during imbedding of the dopants into the semiconductor material, but also a reduction of the thermal budget in annealing the implanted profiles. In addition, for such shallow junctions the desired depth of penetration depends heavily upon the so-called transient enhanced diffusion (TED) influenced by non-balanced weight point defects of the kind which may be generated during the implantation process.

Further processes which may generate non-balanced weight point defects are, among others, the oxidation of silicon which leads to the release primarily of interstitial silicon atoms, and thermal processes in the presence of $SiO_2$ sediments in the crystal mass.

In accordance with the SIA roadmap, the problem of TED in implantation processes has in latter years acquired special significance. A great deal of literature dedicated to this problem has been published, and international workshops and conventions are being organized to this end (such as the International Works hop on Measurement, Characterization and Modeling of Ultra-Shallow Doping Profiles in Semiconductors; (USJ'95, '97, '99) NC, USA).

Various attempts to reduce TED have become known from publications.

Using the transient enhanced diffusion of boron as an example, it was possible to demonstrate that an additional implantation of fluorine ions (see, for instance, D. Fan, J. M. Parks, R. J. Jaccodine; Appl. Phys. Lettr., 59 (10), 1212 (1991)) reduces TED in oxidation processes. The authors ascribed this effect to the inclusion of fluorine in the formed $SiO_2$ micro precipitates which prevent an injection of interstitial atoms during the growths of the precipitate. However, this variant may only be applied if the source for the $Si_i$ is constituted by the growing $SiO_2$ precipitates.

Another attempt to minimize TED consists of forming a layer of silicon nitride on the silicon surface (see, for instance, S. Matsumoto, K. Osada, et al. in Defect and Diffusion Forum, v. 153–155, 25 (1998)). In this layer, tensile stresses are generated during tempering processes which, in turn, lead to pressure stresses in the Si layer close to the surface. This causes the formation of excess point defects —vacancies in the case at hand—which can react in an enhanced manner with the $Si_i$ and thus lead to a reduction of $Si_i$ supersaturation. It is a substantial drawback of this process that the generated mechanical stresses may lead to a plastic deformation of the Si during the heat treatment. The resultant displacements are extremely detrimental as regards the properties of the transistors and switching circuits to be fabricated.

A certain reduction of TED may be achieved by an in situ photo stimulation by UV light during the boron implantation (see, for instance, J. Ravi, Yu. Erokin et al., Appl. Phys. Lett., 67 (15), 2158 (1995)). During implantation the sample was irradiated with a mercury lamp at an energy level of 35 keV and a dose of $5\times10^{14}$ cm$^{-2}$ at a temperature of 177° K. During an ensuing tempering at 800° C., it was found that the depth of penetration had been reduced by about 30 nm.

The disadvantage of this process is its relatively low effect (only about 30 nm) as well as the required effort for cooling the sample during the implantation.

A number of proposals for reducing TED relate to the insertion of carbon into the silicon lattice. The carbon reacts with the $Si_i$ and can reduce its super saturation. (see, for instance, R. Scholz, U. Goesele, J. Y. Huh, T. Y. Tan; Appl. Phys. Lett., 72, 200 (1998)). Tests involving delta doping in Si and SiGe demonstrated (see, for instance, P. A. Stolk, H. J. Gossmann, D. J. Eaglesham; J. Appl. Phys., 81, 6031 (1997) that TED may be reduced by a factor of 150 by an insertion of carbon at a concentration of $1\times10^{20}$ cm$^{-3}$. An additional implantation of carbon at a dose of $2.5\times10^{14}$ cm$^{-2}$ also reduces TED (see, for instance, N. E. B. Cowern, A. Caccieto, J. S. Custer, et al., Appl. Phys. Lett., 68, 1150, (1996)). It was found that the $Si_i$ was reduced by about 1.5 per implanted carbon atom. However, the disadvantage of this process is the necessary incorporation of an additional component (carbon) as well as a possible reaction of the carbon with the boron dopant which may lead to a partial electrical deactivation of the boron atoms. Further disadvantages relate to a deterioration of the transport properties of the Si and stimulated growth of $SiO_2$ precipitates because of the carbon.

Nowadays, ultrasonic processes are used widely in technology, in particular for cleaning surfaces and for modifying structures of powders. Thus, S. Ramesh et al. (S. Ramesh, Y. Koltypin, A. Gedenken, J. Mat. Res., 12 (12) 3271 (1997) make use of ultra sound at an energy level of 100 W/cm$^2$ and a frequency of 20 kHz during the production of amorphous $SiO_2$ spheres. The cavitation effects lead to a change in the size and structure of the particles.

A method of treating the back side of Si wafers by means of ultrasonically vibrating metallic balls is disclosed by U.S.

Pat. No. 4,018,626. The defects formed thereby in the back side of the silicon wafer act as a gettering sink for the point defects generated at the front surface of the wafer and improve the parameters of the semiconductor device fabricated on the wafer.

Using ultrasonic treatment at frequencies between 0.59 MHz and 1.2 MHz, it was possible in layers of polycrystalline $SiO_2$ to stimulate a dissociation of $Fe_i$-B pairs and to extend the diffusion length of minority life expectancies (see S. Ostapenko, L. Jastrzebski, B. Sopori, Semicond. Sci. Technol., 10, 1494 (1995)).

None of these applications of ultrasound in semiconductor technology does, however, refer to solving the problem of fabricating ion implanted doping layers and to the generation of implantation layers of an extremely shallow penetration depth.

OBJECTS OF THE INVENTION

It is an object of the invention to provide a markedly improved method of fabricating ion implanted doping layers in semiconductor materials which while preventing transient enhanced diffusion makes it possible to produce extremely shallow doping profiles for use in the fabrication of semiconductor devices by large-scale industrial processes.

A further object of the invention resides in the provision of a method of the kind referred to of reducing, in a qualitatively different manner, TED during the implantation process by exertion of a deliberate effect, in situ, on the implantation process.

Further objects will in part be obvious and will in part appear hereinafter.

BRIEF SUMMARY OF THE INVENTION

In the accomplishment of these and other objects, the invention, in preferred embodiments thereof, provides for reducing the transient enhanced diffusion typically occurring during the implantation process by subjecting the semiconductor crystal, during the implantation process, to the effect of ultrasonic oscillations at a power of between 50 $W/m^2$ and 104 $W/m^2$ in a frequency range between 0.01 MHz and 100 MHz.

During this process, the back side of the semiconductor crystal is affixed to a piezo element, such as, for instance lithium niobate, cadmium sulfide or piezo-ceramic material, by way of an acoustic link, for instance an oil suitable for hard vacuum treatment, and is then introduced into the implanting chamber. Directly during the implantation process the semiconductor crystal is subjected to ultrasonic vibrations at a power of between $10^2 W/m^2$ and $10^4 W/m^2$ in a frequency range from 0.01 MHz to 100 MHz. The introduction of ultrasound does not lead to any significant increase in the temperature of the Si wafer. Following implantation, tempering of the samples takes place in a temperature range necessary for the electrical activation of the dopant.

The depth distribution of the impurities in the semiconductor crystal with or without ultrasonic treatment can be measured by secondary ion mass spectrometry (SIMS). In addition, the samples were classified as to their homogeneity by measuring the electrical resistance of their layers.

The advantage derived from the invention resides in the fact that it is possible directly during the implantation process to suppress the formation of highly mobile doping atoms during a subsequent temperature treatment.

The method in accordance with the invention may be practiced on an industrial scale in modern implantation equipment and is thus suitable for economically solving the problem of TED for modern circuit generations.

DESCRIPTION OF THE SEVERAL DRAWINGS

The novel features which are considered to be characteristic of the invention are set forth with particularity in the appended claims. The invention itself, however, in respect of its structure, constitution and lay-out, as well as manufacturing techniques, together with other objects and advantages thereof, will best be understood from the following description of preferred embodiments when read with reference to the appended drawings, in which:

DETAILED DESCRIPTION OF THE PREFERRED EMBODIMENTS

Figure 1:
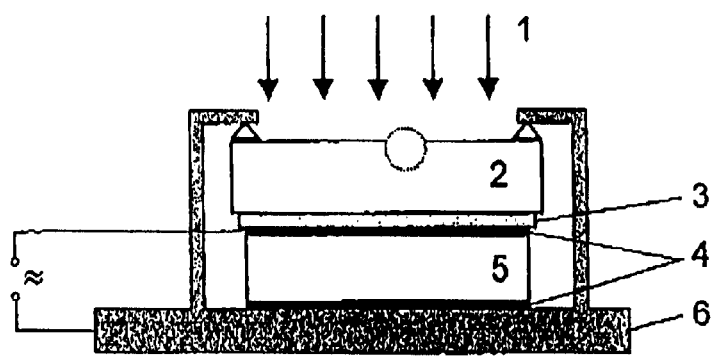
FIG. 1 is a schematic presentation of a device for fabricating ion implanted doping layers.

FIG. 1 schematically depicts a device for fabricating ion implanted doping layers. An ion beam 1 of ionized impurities and predetermined current density impinges upon a silicon wafer 2, either unstructured or provided with conventionally produced implantation masks. At its back side, the silicon wafer 2 is affixed to a piezo element 5, consisting preferably of lithium niobate ($LiNbO_3$), CdS or piezo-ceramic materials (e.g. PZT) by an acoustic binder 3 consisting preferably of an oil suitable for hard vacuum treatment and a metal contact 4. Directly during the implantation process, such as, for instance, a boron implantation at an implantation energy in the range of from 5 keV to 100 keV and implantation doses in the range from $1\times10^{13}$ $cm^{-2}$ to $5\times10^{14}$ $cm^{-2}$, the silicon wafer is subjected to ultrasonic vibrations at a power of $10^3$ $W/m^2$ and a frequency of 7 MHz. During this time, the piezo element 5 is energized by way of ground 6 and the metal contacts 4.

Following the implantation, tempering of the samples is carried out in a temperature range between 650° C. and 1,150° C. for between 10 sec and 60 min.

Figure 2:
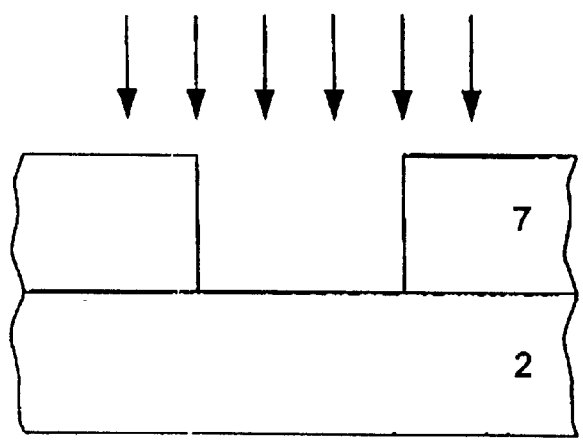
FIG. 2 is a schematic presentation of a section near the surface of a silicon wafer.

FIG. 2 depicts a section near the surface of the silicon wafer 2. The surface may be formed either by a monocrystalline or pre-amorphized silicon substrate of the kind resulting from different processes typical of the fabrication of integrated circuits. It may also be a thin layer of scattered oxide or nitride of the kind resulting from various processes for fabricating integrated circuits. But is may also consist of homo- and/or hetero-epitaxial grown layers of the kind yielded by various typical processes of fabricating integrated circuits.

The ion beam 1 consisting of primary ions of elements, (e.g. B, As, P or molecular ions (e.g. $BF_2^+$) conventional in the semiconductor industry and as used in a known manner for the fabrication of ion implanted doping layers for fabricating integrated circuits impinges on the described surface layer of the silicon wafer 2 within the opened areas of the implantation mask 7.

Figure 3:
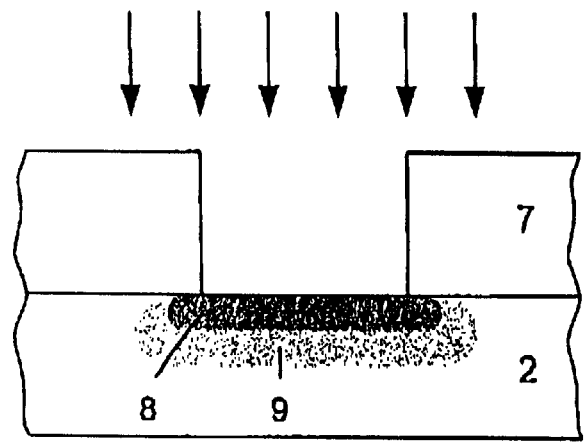
FIG. 3 is a schematic presentation of implanted areas following activation of the doping atoms with and without ultrasonic treatment.

FIG. 3 schematically depicts the implanted areas 8, 9 following activation with and without ultrasonic treatment.

The implanted area 8 is derived from ultrasonic treatment; the area 9 is derived without ultrasonic treatment.

Figure 4:
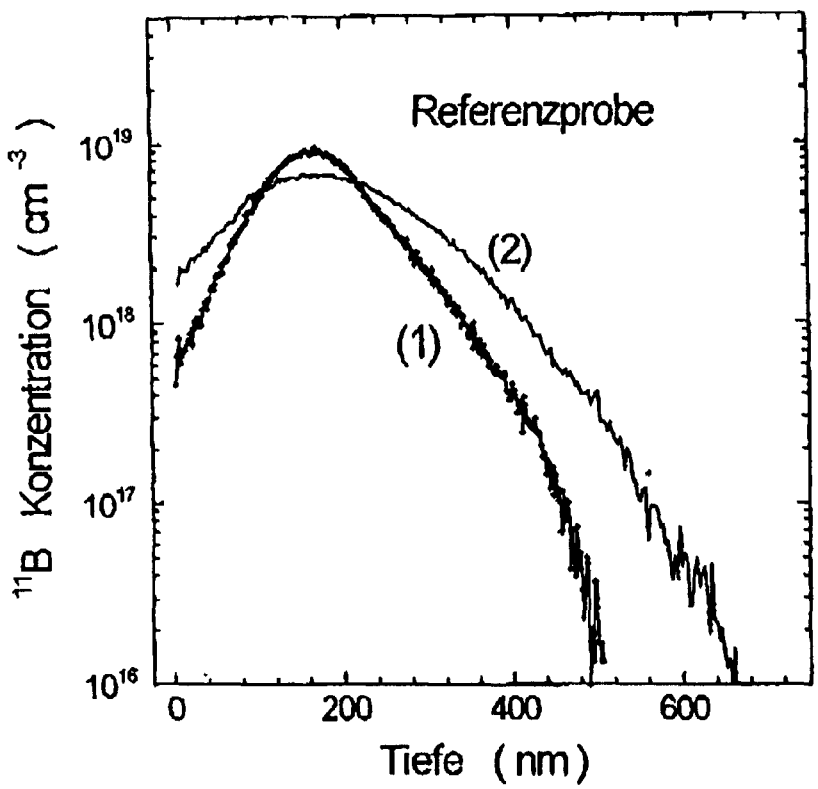
FIG. 4 Is a diagram of a boron depth profile without ultrasonic treatment.

FIG. 4 is a boron depth profile of a reference curve not ultrasonically treated before (curve 1) and after (curve 2) tempering at 950° C. for 30 sec. Compared to the untempered sample a substantial profile shift of about 100 nm occurs as a result of TED.

Figure 5:
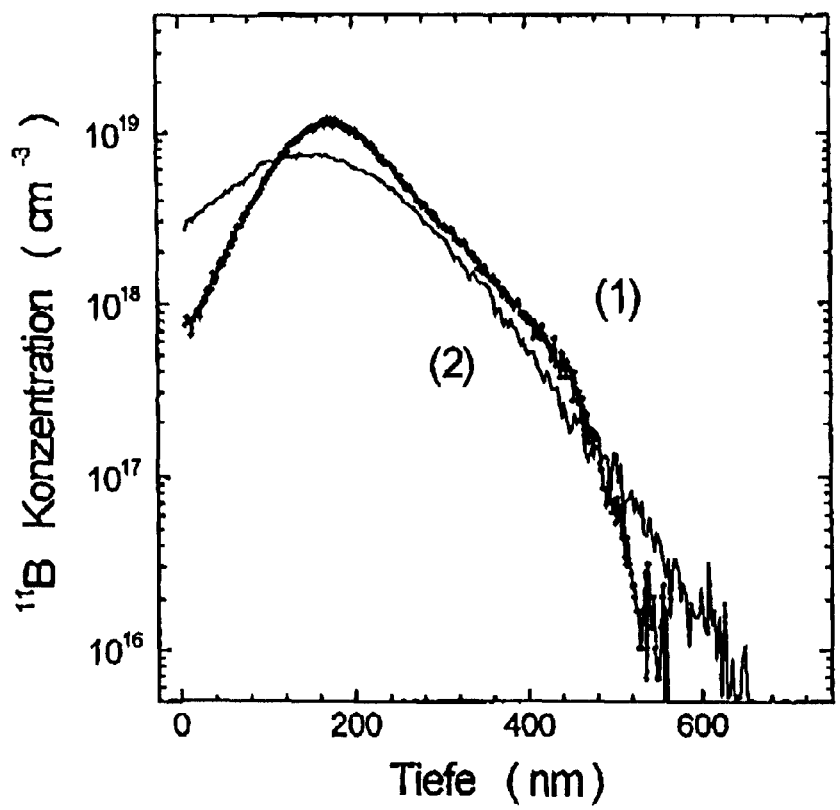
FIG. 5 is a diagram of a boron depth profile following ultrasonic treatment.

FIG. 5 is a boron depth profile recorded by secondary ion mass spectrometry (SIMS) of a sample treated ultrasonically before (curve 1) and after (curve 2) at the same temperature, 950° C. for 30 sec.

When compared to the reference sample (FIG. 4) not treated in the manner of the invention, no blurring of the tempered profile occurs as a result of TED. Moreover, a shifting of the profile by about 30 nm relative to the surface was detected during tempering which is extremely useful for the production of extremely shallow junctions.

An electric characterization of the wafer by means of measuring the resistance of its layers displayed good electrical activation of the boron in the examined dosage range, in ultrasonically treated samples as well as in reference samples. Thus, at an implantation dosage of $2 \times 10^{14}$ cm$^{-2}$ the layer resistance values were about 190 Ω/square in both samples.

At adequate current densities which themselves generate ultrasonic vibrations in the semiconductor material and which are reflected by the piezo deposition, an active generation of ultrasonic vibrations by the application of an external electric voltage is not necessary, for in the structure described in connection with FIG. 1 the ultrasonic vibrations generated by the implanted ions themselves will yield a positive effect.

By the coupling into the Semiconductor material ultrasound at a power between $10^2$ W/m$^2$ and $10^4$ W/m$^2$ and a frequency from 0.01 MHz to 100 MHz it is possible to reduce the critical amorphizing dosages of the ions in the semiconductor material. This is reflected by a favorable annealing behavior of the implanted layers and reduced density defects. This, in turn, improves the electrical properties of the alloy layers.

By ultrasonic coupling at a power between $10^2$ W/m$^2$ and $10^4$ W/m$^2$ and a frequency from 0.01 MHz and 100 MHz into semiconductor material, or at current densities in excess of 0.1 μA/cm$^2$ even without active ultrasound coupling, it is possible to affect or influence impurities already present in the semiconductor in respect of their spatial distribution and/or electric activity as they occur during the implantation and thermal post treatment.

An advantage of the invention resides in the fact that because of the treatment in accordance with the invention it is not necessary to inject into the semiconductor material additional impurities, as, for instance, carbon atoms, in order to reduce TED.

Methods of fabricating ion implanted doping layers in semiconductor materials and the fabrication of integrated circuits have been set forth herein on the basis of a concrete embodiment. It is to be noted, however, that the present invention is not limited to details of the described embodiment, as alterations and variations are to be determined by the scope of protection of the claims.

What is claimed is:

1. A method of fabricating an ion implanted doping layer in semiconductor materials, comprising the steps of:

providing a wafer of semiconductor material having first and second surfaces;

mounting the wafer at one of its first and second surfaces to a piezo-electric support; and subjecting the wafer at the other of the first and second surfaces to an implantation process and to ultrasonic vibrations applied from an exterior source to the piezo-electric support at a power of between 50 W/m$^2$ and $10^4$ W/m$^2$ and a frequency of between 0.01 MHZ and 100 MHZ.

2. The method of claim 1, wherein the piezo-electric support comprises an element from the group consisting of lithium niobate, cadmium sulfide and piezo-ceramic materials.

3. The method of claim 1, wherein the wafer is mounted on the piezo-electric support by an acoustic binder.

4. The method of claim 3, wherein the acoustic binder comprises an oil suitable for high vacuum treatment.

5. The method of claim 1, wherein the implantation process is conducted at a primary current of a density in excess of 0.1 μA/cm$^2$ the reflection of which from the piezo-electric support contributes to the ultrasonic vibrations.

6. The method of claim 1, wherein the implantation process and the application of the ultrasonic vibrations are carried out simultaneously with the ultrasonic vibrations being coupled at a power of between $10^2$ W/m$^2$ and $10^4$ W/m$^2$ for reducing the critical amorphization dose of the implantation.

7. The method of claim 1, further comprising the steps of:

additional implantations and simultaneous coupling of ultrasound at a power of between 50 W/m$^2$ and $10^4$ W/m$^2$ and a frequency of from 0.01 MHZ to 100 MHZ for altering depth and lateral distributions of the dopant impurities.

8. A method of fabricating ion implanted doping layers in semiconductor materials, comprising the steps of:

providing a wafer of semiconductor material having first and second surfaces;

mounting the wafer at one of its first and second surfaces to a piezo-electric support; and subjecting the wafer to an implantation process by a current of a density in excess of 0.1 μA/cm$^2$ thereby to generate ultrasonic vibrations in the semiconductor material by reflection of the current from the piezo-electric material.

* * * * *